US007919993B2

(12) United States Patent
Keel et al.

(10) Patent No.: US 7,919,993 B2
(45) Date of Patent: Apr. 5, 2011

(54) CORRELATED DOUBLE SAMPLING CIRCUIT

(75) Inventors: Min-Sun Keel, Seoul (KR); Kwang-Hyun Lee, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 12/318,800

(22) Filed: Jan. 8, 2009

(65) Prior Publication Data

US 2009/0212827 A1 Aug. 27, 2009

(30) Foreign Application Priority Data

Feb. 21, 2008 (KR) .................. 10-2008-0015920

(51) Int. Cl.
  *G11C 27/02* (2006.01)
  *H03K 5/00* (2006.01)
  *H03K 17/00* (2006.01)
(52) U.S. Cl. ..................... 327/94; 327/130; 327/131
(58) Field of Classification Search .............. 327/94, 327/130, 131
See application file for complete search history.

(56) References Cited

U.S. PATENT DOCUMENTS

2004/0041927 A1* 3/2004 Cho et al. ............... 348/254
2006/0274557 A1* 12/2006 Ball et al. ............... 363/19

FOREIGN PATENT DOCUMENTS

| KR | 10-2001-0013303 | 2/2001 |
| KR | 10-2005-0079729 | 8/2005 |
| KR | 10-2006-0093911 | 8/2006 |

* cited by examiner

*Primary Examiner* — Lincoln Donovan
*Assistant Examiner* — Diana J Cheng
(74) *Attorney, Agent, or Firm* — Harness, Dickey & Pierce, PLC

(57) ABSTRACT

A correlated double sampling circuit includes a first capacitor and a comparator. The first capacitor may be configured to receive a ramp signal via a first end. The comparator may be configured to receive the ramp signal and an output signal of a unit pixel circuit via a differential amplifier included in the comparator. The comparator may be also be configured to compare the output signal with the ramp signal and may be configured to directly receive the output signal of the unit pixel circuit at a first input terminal of the differential amplifier. A second input terminal of the differential amplifier is connected to a second end of the first capacitor.

14 Claims, 6 Drawing Sheets

CORRELATED DOUBLE SAMPLING CIRCUIT

PRIORITY STATEMENT

This application claims the benefit of priority under 35 U.S.C. §119 to Korean Patent Application No. 10-2008-0015920, filed on Feb. 21, 2008, in the Korean Intellectual Property Office, the entire contents of which is incorporated herein in its entirety by reference.

BACKGROUND

1. Field

Example embodiments relate to a correlated double sampling (CDS) circuit, and more particularly, to a CDS circuit capable of reducing occurrences of parasitic capacitance.

2. Description of Related Art

An image sensor is a device that captures an image by using the characteristics of a semiconductor that reacts to light. In general, the image sensor may be formed using a plurality of unit pixels made of a complementary metal oxide semiconductor (CMOS). Such an image sensor is referred to as a 'CMOS image sensor (CIS)'.

In general, the CMOS image sensor may be driven according to a correlated double sampling (CDS) method. An output signal of a unit pixel is converted into digital code via an analog-to-digital converter (ADC). The ADC may include the ADC and a plurality of comparators, the total number of which is equal to the total number of columns in a pixel array. The comparators perform conversion of a pixel signal into a digital signal, and thus influence the quality of an output image.

FIG. 1 is a block diagram of a conventional CMOS image sensor circuit 100 that is driven according to the CDS method. For example, the conventional CMOS image sensor circuit 100 includes an active pixel sensor array 11, an ADC 12 that can perform correlated double sampling, a data latch & horizontal decoder 13, a ramp signal generator 14, a row driver 15, and a timing generator 16.

In the ADC 12, a plurality of unit CDS circuits, the total number of which is equal to the total number of columns in the active pixel array 11 may be included. In general, a single-slope ADC may be used because analog output signals of a plurality of pixels of each of columns are simultaneously converted to digital code.

The construction and operation of a CMOS image sensor according to the CDS method as illustrated in FIG. 1 are considered to be commonly known to those of ordinary skill in the technical field to which the present invention pertains, and therefore, a detailed description of a CMOS image sensor will be omitted here.

FIG. 2 is a circuit diagram of a conventional CDS circuit 230. Referring to FIG. 2, the CDS circuit 230 includes a comparator 250 and capacitors C100 and C200.

A unit pixel circuit 310 includes four transistors M1, M2, M3, and M4, and a photo diode D1. The CDS circuit 230 converts an output signal Vin received from the unit pixel circuit 310 into a digital signal through correlated double sampling, by using a ramp signal VRAMP. In the CDS circuit 230, a plurality of switches S100 and S200, two capacitors C100 and C200, and a comparator 250 including an inverter (not shown) are included.

The operation and construction of the CDS circuit 230 illustrated in FIG. 2 are considered to be commonly known to those of ordinary skill in the technical field to which the present invention pertains, and thus, a detailed description of the CDS circuit 230 will be omitted.

Signal attenuation occurring in the CDS circuit 230 when the output signal Vin of the unit pixel circuit 310 is supplied to the comparator 250, and will now be described.

Referring to FIG. 2, in the conventional CDS circuit 230, the comparator 250 indirectly receives the output signal Vin from the unit pixel circuit 310 via the capacitor C200.

Because of the devices (switch S100 and capacitor C200) between output terminal of the unit pixel circuit 310 and input terminal of the comparator 250, a p-n junction, an oxide layer, routing metal, and a metal contact may be generated.

Then, for example, the p-n junction, the oxide layer, routing metal, and the metal contact may cause parasitic capacitors, such as a gate-oxide capacitor and a junction capacitor, generated near the input terminal of the comparator 250.

Generation of a parasitic capacitor near the input terminal of the comparator 250 may cause a loss in the output signal Vin of the unit pixel circuit 310, for example, it may degrade the magnitude of the output signal Vin, and substantially, the degraded signal may be transmitted to the input terminal of the comparator 250. If the parasitic capacitor generated near the comparator 250 is Cpara, a signal Vin1 may be transmitted to the input terminal of the comparator 250 (a third node N300 in FIG. 2) and can be expressed as follows:

$$Vin1 = (Vres - Vsig) \cdot \frac{C200}{C200 + Cpara}, \quad (1)$$

wherein Vres denotes a voltage of a signal output from the unit pixel circuit 310 when a floating diffusion node FD is reset, Vsig denotes a voltage of a signal output from the unit pixel circuit 310 when the transmission transistor M2 is turned on, C200 denotes the capacitance of the second capacitor C200 connected between the input terminal of the comparator 250 and an output terminal of the unit pixel circuit 310, and Cpara denotes the parasitic capacitance generated at the input terminal of the comparator 250.

As image sensors tend to become more miniaturized and have higher definition, the size of one unit pixel, pixel pitch, and the distance between routing lines may be reduced. If pixel pitch and the distance between routing lines are reduced, the capacitance of the parasitic capacitor Cpara may be increased significantly. Thus, a considerable voltage reduction may occur in the signal Vin1 that is an image signal supplied to the comparator 250.

A reduction in the magnitude of an image signal may result in a reduction in the sensitivity of an output image.

Also, the slope of the ramp signal Vramp may need to be lowered by the loss in the output signal Vin1 supplied to the comparator 250. Thus, the magnitude of noise, such as horizontal noise, which is generated by the ramp signal generator 14 may be increased more than the magnitude of the image signal. This is because the magnitude of the image signal is reduced but the magnitude of the noise is not changed, and thus, the noise may become more apparent in the output image.

SUMMARY

An embodiment of the present invention may provide a correlated double sampling (CDS) circuit capable of reducing an occurrence of a parasitic capacitor.

According to an embodiment, a correlated double sampling circuit including a first capacitor may be configured to receive a ramp signal via a first end; and a comparator configured to receive the ramp signal and an output signal of a unit pixel circuit via a differential amplifier may be included in the comparator. The comparator may be configured to compare the output signal with the ramp signal, wherein the comparator being configured to directly receive the output signal of the unit pixel circuit at a first input terminal of the differential amplifier, and a second input terminal of the differential amplifier being connected to a second end of the first capacitor.

According to an embodiment, the circuit may further include a second capacitor, having a first end connected to the first input terminal of the differential amplifier and a second end connected to a ground voltage source.

According to an embodiment, the circuit may further include a first switch configured to selectively allow the output signal of a unit pixel circuit to be received by the first input terminal of the differential amplifier, such that the first switch may control the application of the image signal to the first input terminal of the differential amplifier, in response to a first switch control signal.

According to an embodiment, the circuit may further include a second switch configured to selectively allow the ramp signal to be received by the first end of the first capacitor such that the second switch is configured to control the application of the ramp signal to the second input terminal of the differential amplifier, in response to a second switch control.

According to an embodiment, the second capacitor may be an n-type metal oxide semiconductor (NMOS) capacitor.

According to an embodiment, the comparator may further include a third switch connected between the second input terminal of the differential amplifier and an output terminal of the differential amplifier. The third switch is configured to turn on in response to a third switch control signal.

According to an embodiment, a first switch may be configured to selectively allow the ramp signal to be received by the first end of the first capacitor such that the first switch is configured to control application of the ramp signal to the second input terminal of the differential amplifier, in response to a first switch control.

According to an embodiment, a first switch may be configured to selectively allow the ramp signal to be received by the first end of the first capacitor such that the first switch is configured to control application of the ramp signal to the second input terminal of the differential amplifier, in response to a first switch control.

According to an embodiment, the comparator may further include a first switch connected between the second input terminal of the differential amplifier and an output terminal of the differential amplifier, the first switch configured to turn on in response to a first switch control signal.

According to an embodiment, a first capacitor may be configured to receive a ramp signal via a first end; and a comparator may be configured to receive the ramp signal and an output signal of a unit pixel circuit via a differential amplifier included in the comparator. The comparator also may be configured to compare the output signal with the ramp signal and configured to receive the output signal of the unit pixel circuit at a first input terminal of the differential amplifier, and a second input terminal of the differential amplifier being connected to a second end of the first capacitor, wherein no capacitor is disposed between the unit pixel circuit and the first input terminal.

According to an embodiment, a second capacitor may be included having a first end connected to the first input terminal of the differential amplifier, and a second end connected to a ground voltage source.

According to an embodiment, a first switch may be configured to selectively allow the output signal of a unit pixel circuit to be received by the first input terminal of the differential amplifier such that the first switch may control application of an image signal to the first input terminal of the differential amplifier, in response to a first switch control signal.

According to an embodiment, a second switch may be configured to selectively allow the ramp signal to be received by the first end of the first capacitor such that the second switch may be configured to control application of the ramp signal to the second input terminal of the differential amplifier, in response to a second switch control.

According to an embodiment, the second capacitor may be an n-type metal oxide semiconductor (NMOS) capacitor.

According to an embodiment, the comparator may further include a third switch connected between the second input terminal of the differential amplifier and an output terminal of the differential amplifier. The third switch may be configured to turn on in response to a third switch control signal.

According to an embodiment, a first switch may be configured to selectively allow the ramp signal to be received by the first end of the first capacitor such that the first switch is configured to control application of the ramp signal to the second input terminal of the differential amplifier, in response to a first switch control.

According to an embodiment, the comparator may further include a first switch connected between the second input terminal of the differential amplifier and an output terminal of the differential amplifier. The first switch may be configured to turn on in response to a first switch control signal.

BRIEF DESCRIPTION OF THE DRAWINGS

The above and/or other features and advantages will become more apparent and more readily appreciated from the detailed description of embodiments of the present invention thereof with reference to the attached drawings in which.

DETAILED DESCRIPTION OF EXAMPLE EMBODIMENTS

Figure 1:
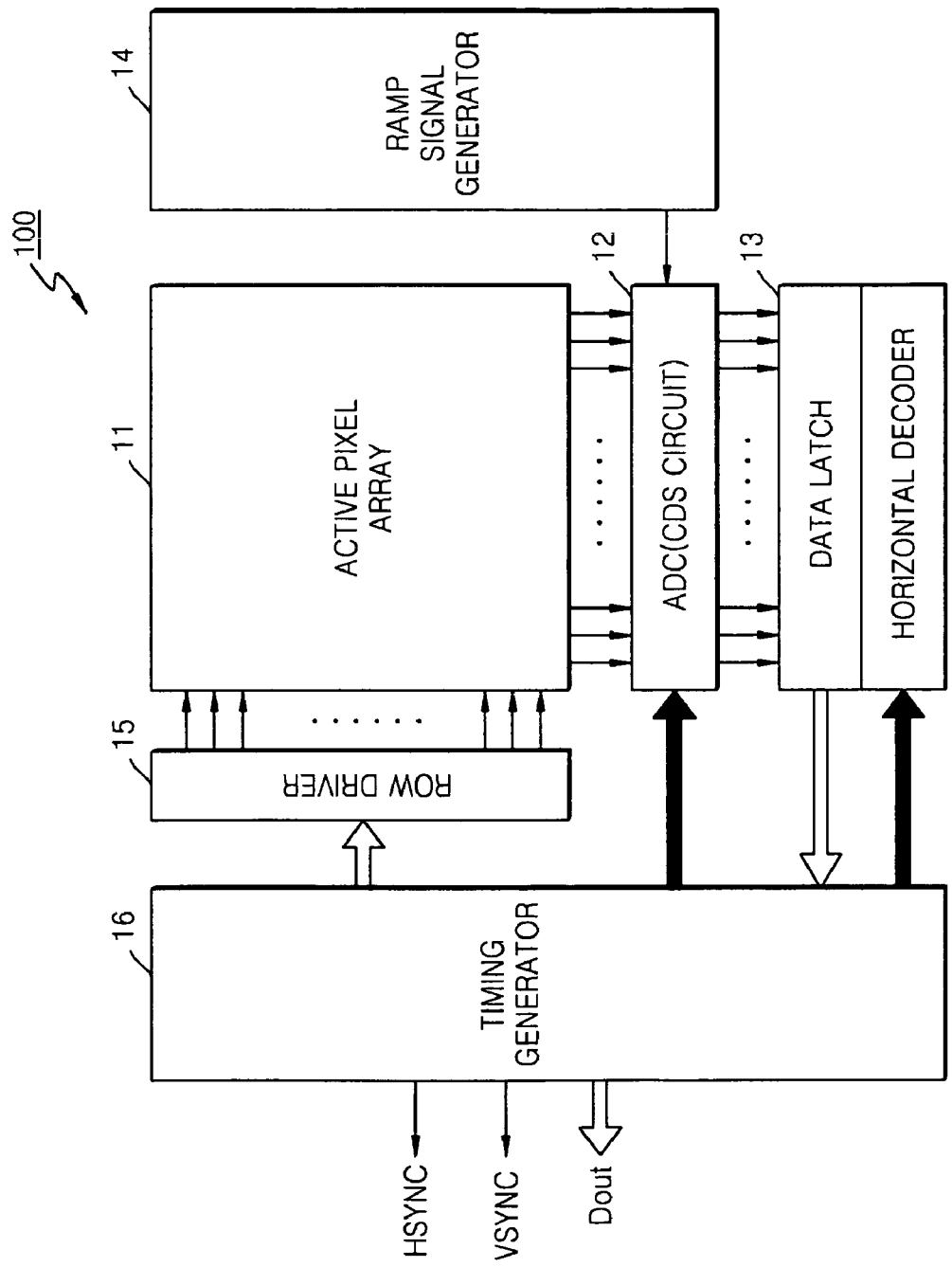
FIG. 1 is a block diagram of a conventional complementary metal oxide semiconductor (CMOS) image sensor circuit.

Example embodiments of the present invention will now be described in more detail with reference to the accompanying drawings. Like reference numerals denote like elements throughout the drawings.

Example embodiments may be in different forms and should not be construed as limited to the embodiments set forth herein. Rather, these embodiments are provided so that this disclosure will be thorough and complete, and will fully convey the scope to those skilled in the art.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality and/or acts involved.

Although the example embodiments of the present invention have been disclosed for illustrative purposes, those skilled in the art will appreciate that various modifications, additions and substitutions are possible, without departing from the scope and spirit of the invention as disclosed in the accompanying claims.

Figure 3A:
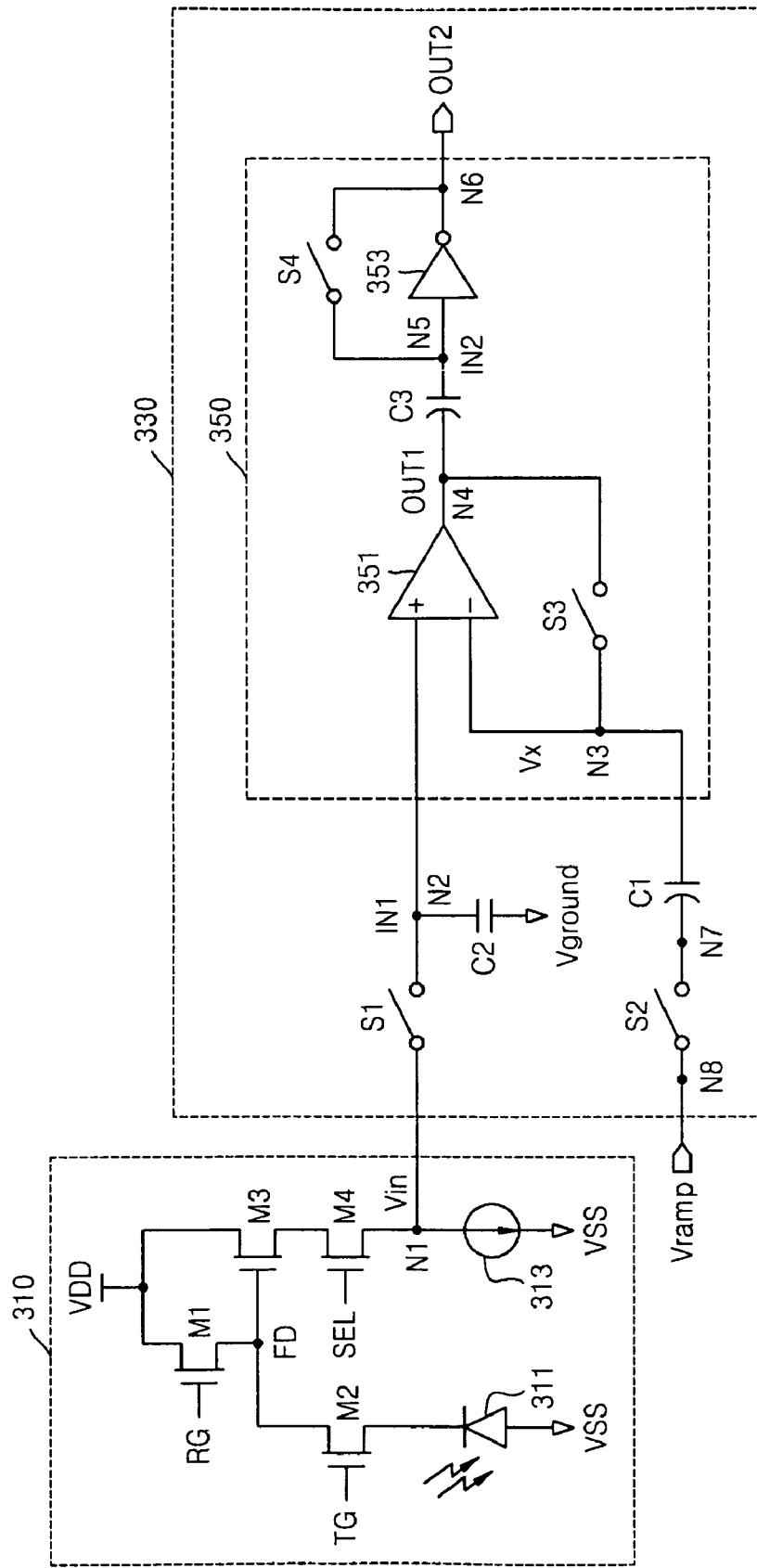
FIG. 3A is a circuit diagram of a CDS circuit according to an embodiment of the inventive concept.
Figure 5:
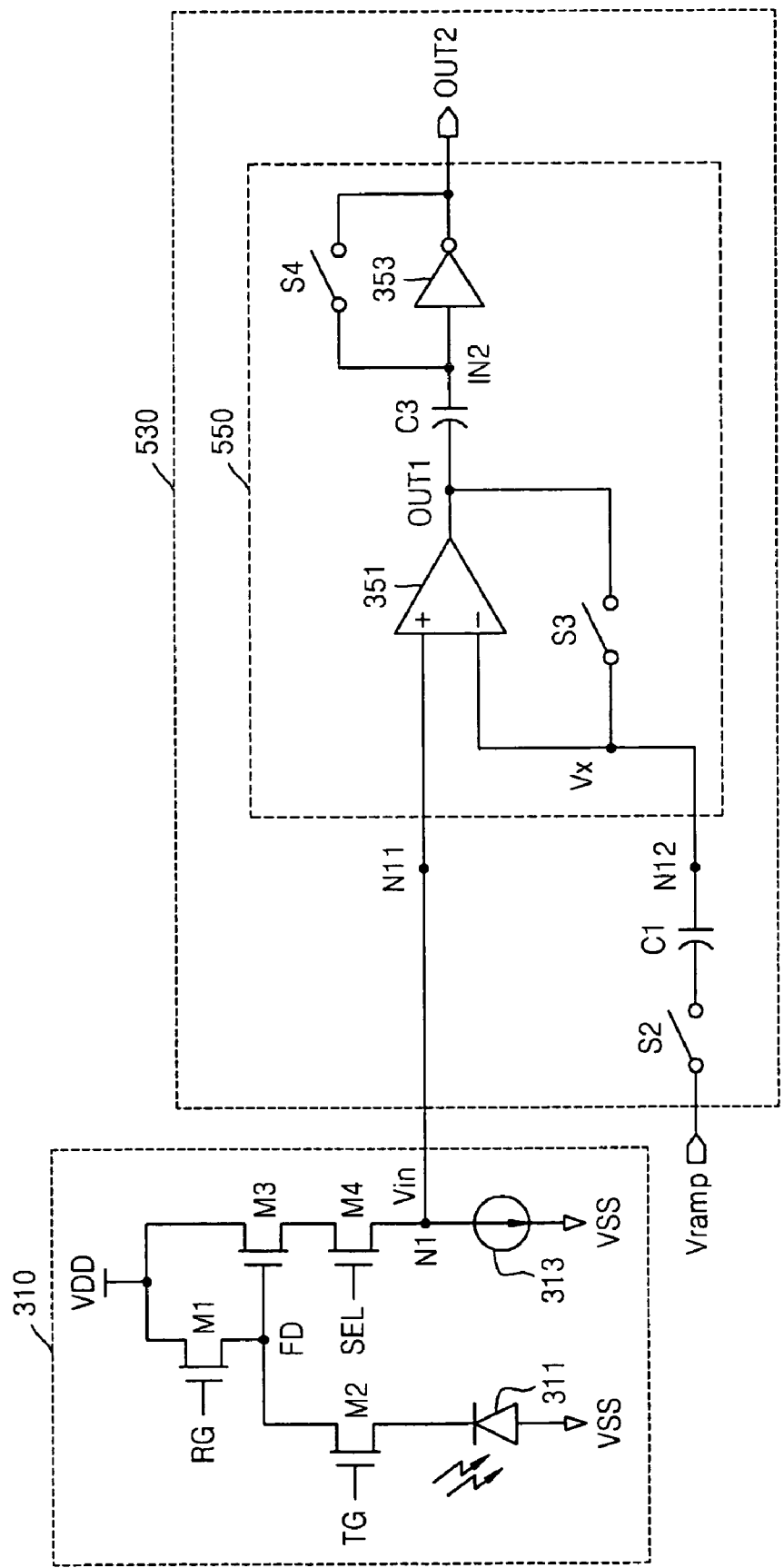
FIG. 5 is a circuit diagram of a modified version of the correlated double sampling circuit of FIG. 3A, according to an embodiment of the present invention.

FIG. 3A is a circuit diagram of a correlated double sampling (CDS) circuit 330 according to an embodiment of the present invention. Referring to FIG. 3A, the CDS circuit 330 includes a first capacitor C1 and a comparator 350. The CDS circuit 330 may further include a second capacitor C2. FIG. 3A illustrates a case where the second capacitor C2 is included, whereas FIG. 5 illustrates a case where the second capacitor C2 is not included. Reference numeral 310 denotes a unit pixel circuit included in the active pixel array 11 illustrated in FIG. 1.

The first capacitor C1 receives a ramp signal Vramp via a second switch S2. The first capacitor C1 blocks a DC voltage of the ramp signal generator 14 of FIG. 1 which may be included in the ramp signal Vramp, so that only a transient voltage of the ramp signal Vramp can be delivered to a third node N3.

When a transmission transistor M2 is turned on, voltage level of the output terminal Vin of the unit pixel circuit 310 may be determined.

The comparator 350 receives the ramp signal Vramp via a negative input terminal and an output signal Vin of the unit pixel circuit 310 via an positive input terminal of a differential amplifier 351 included in the comparator 350. The comparator may perform correlated double sampling on the ramp signal Vramp and the output signal Vin and then outputs the resultant signals OUT2.

For example, the comparator 350 continuously compares the output signal Vin of the unit pixel circuit 310 with the ramp signal Vramp. A point of time when a voltage of the ramp signal Vramp is equal to that of the output signal Vin of the unit pixel circuit 310 may be detected based on the comparing result. A counter code value corresponding to a period between when a ramp activation signal that is at an activation level (for example, when the ramp activation signal goes logic high) is output at the point of time. The counter code value may be used as a gain of analog-to-digital conversion.

If the differential amplifier 351 is included in the input stage of the comparator 350, a power supply rejection ratio (PSRR) may be better than when an inverter is not included in the input stage of the comparator 350. Here, the PSRR of the CDS circuit 330 indicates whether the CDS circuit 330 may maintain a constant output (or may operate normally) when the power supply voltage varies. Thus, the PSRR of the CDS circuit 330 in a current embodiment may be maintained at an optimal level by including the differential amplifier 351 in the input stage of the comparator 350.

In an embodiment, the CDS circuit 330 may further include a second capacitor C2. One end of the second capacitor C2 is connected to a second node N2 that is the positive input terminal of the differential amplifier 351. The other end of the second capacitor C2 may be connected to a ground voltage source Vground. The second capacitor C2 may store a difference potential (Vres−Vsig) between a potential Vres of the voltage level at the output terminal of the unit pixel circuit 310 when a reset transistor M1 is turned on and a potential Vsig of the voltage level at the output terminal of the unit pixel circuit 310 when a transmission transistor M2 is turned on.

Here, the second capacitor C2 may be an n-type metal oxide semiconductor (NMOS) capacitor.

Figure 3B:
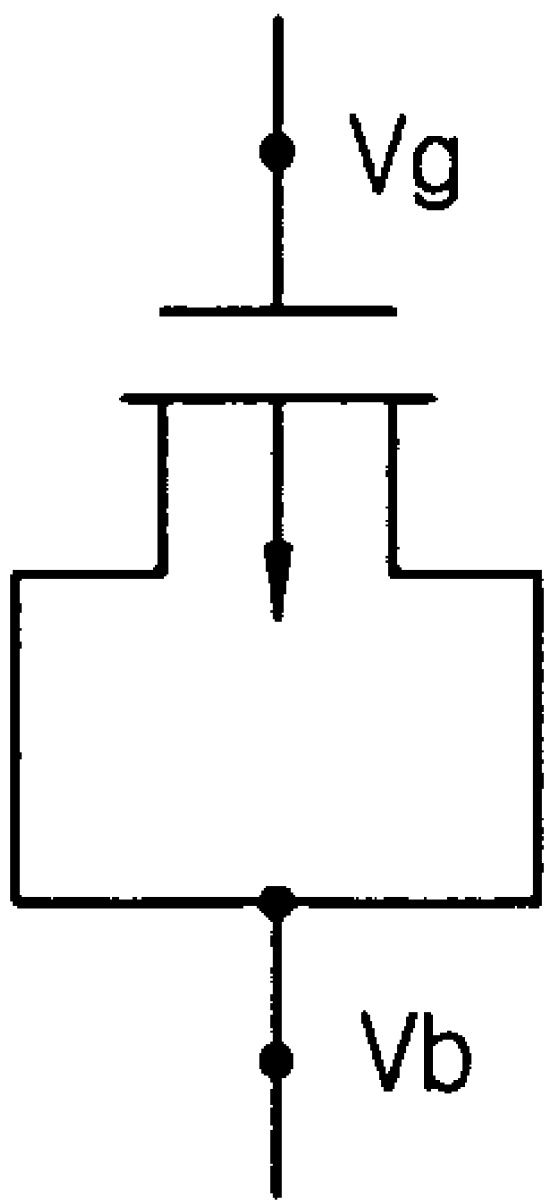
FIG. 3B is a circuit diagram of an n-type metal oxide semiconductor (NMOS) capacitor that may be used as a second capacitor C2 illustrated in FIG. 3A, according to an embodiment of the present invention.

According to an embodiment, FIG. 3B is a circuit diagram of an NMOS capacitor that may be used as the second capacitor C2 illustrated in FIG. 3A. Referring to FIGS. 3A and 3B, one electrode Vg of the NMOS capacitor is connected to the second node N2, and another electrode Vb thereof is connected to the ground voltage source Vground.

A signal (voltage) is not applied to both electrodes of the second capacitor C2 but instead is applied to only one electrode of the second capacitor C2. That is, a signal is applied to one electrode Vg of the NMOS capacitor, and a bottom plate that is the other electrode Vb of the NMOS capacitor is connected to the ground voltage source Vground.

Only the second capacitor C2 receives a voltage signal via one end (electrode) of the second capacitor C2 from among a plurality of capacitors included in the CDS circuit 330. Thus, an NMOS capacitor may be available as only the second capacitor C2 because a signal may be transmitted to one end of the second capacitor C2 and the other end of the second capacitor C2 may be connected to the ground voltage source Vground. The other capacitor in which a voltage signal is applied to both ends may be embodied using a metal-insulator-metal (MIM) capacitor or a poly-insulator-poly (PIP) capacitor.

The area of the NMOS capacitor may be less than that of a metal-insulator-metal (MIM) capacitor or a poly-insulator-poly (PIP) capacitor. Accordingly, the area of a CDS circuit 330 using an NMOS capacitor as the second capacitor C2 may be much smaller than that of another CDS circuit using a general capacitor.

Referring to the comparator 350 of FIG. 3A, when the third switch is turned on, the output signal of the differential amplifier OUT1 is applied to the fourth node N4 to connect to the third node N3, and via feedback, the output signal of the differential amplifier OUT 1 is connected to an negative input terminal of a differential amplifier 351.

Furthermore, a capacitor C3 receives the output signal of the differential amplifier OUT 1 and inputs a signal IN2 to an inverter 353 at the fifth node N5. The inverter 353 outputs a voltage signal OUT 2 of opposite logic-level to the input signal IN2. When the fourth switch S4 is turned on, the signal output at the sixth node N6 connects to the fifth node N5.

Referring to FIG. 3B, the body terminal Vb of the NMOS capacitor is connected to the ground voltage source Vground, and the gate terminal Vg of the NMOS capacitor is connected to the second node N2 that is one input terminal of the comparator 350.

According to an embodiment, the CDS circuit 330 may further include the first switch S1 connected between a first node N1 in the unit pixel circuit and the second node N2. Also, the CDS circuit 330 may further include the second switch S2 connected between an eighth node N8 and a seventh node N7.

The first and second switches S1 and S2 are respectively turned on or off in response to a first switch control signal C_S1 and a second switch control signal C_S2. The first and second switch control signals C_S1 and C_S2 are applied from outside the CDS circuit 330. For example, the first and second switch control signals C_S1 and C_S2 may be generated and provided by the timing generator 16 illustrated in FIG. 1, similar to a transmission control signal TG and a reset control signal RG.

The unit pixel circuit 310 may include four transistors M1, M2, M3, and M4, and a photo diode 311. For example, M1, M2, M3 and M4, respectively, denote a reset transistor, a transmission transistor, a source follower transistor, and a selection transistor. The photo diode 311 may receive light and may generate a plurality of photo charges corresponding to the amount of light. Reference numeral 313 may denote a source follower.

The unit pixel circuit 310 may output a voltage corresponding to the photo charges as an image signal Vsig to the first node N1. Here, Vin denotes an output signal of the unit pixel circuit 310. The output signal Vin of the unit pixel circuit 310 may be divided into_the image signal Vsig and a reset signal Vres. The image signal Vsig may be a signal generated corresponding to the amount of collected photo charges. The reset signal Vres may be a signal output to the first node N1 when the reset transistor M1 is turned on so as to reset the voltage of the floating diffusion node FD to a high power supply voltage VDD.

Figure 4:
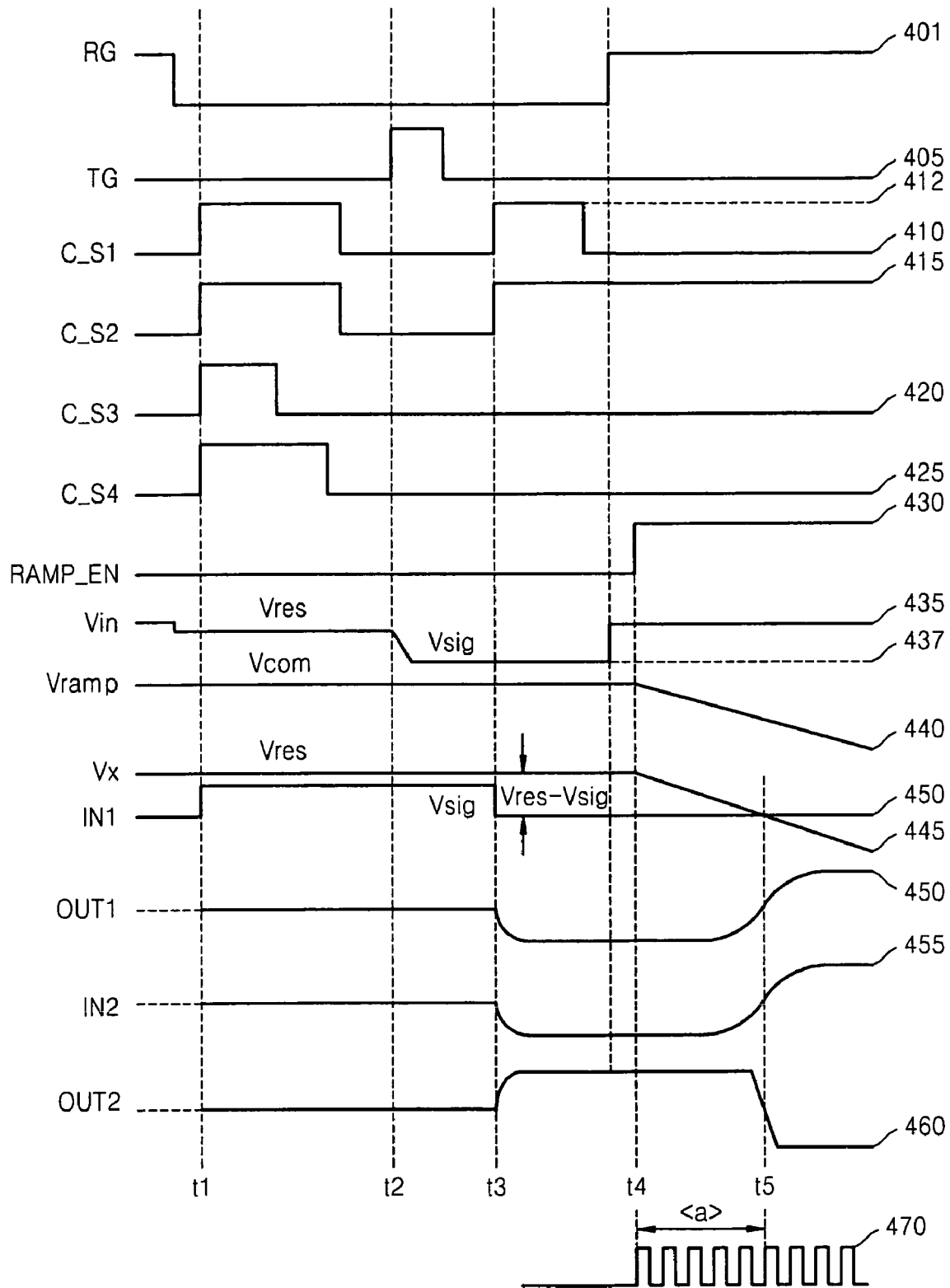
FIG. 4 is a timing diagram illustrating signals input to or output from the CDS circuit of FIG. 3A, and the operation of the CDS circuit according to an embodiment of the present invention.

According to an embodiment, FIG. 4 is a timing diagram illustrating signals input to or output from the CDS circuit 330 of FIG. 3A, and the operation of the CDS circuit 330. Referring to FIGS. 3A and 4, RG 401 denotes a reset control signal applied to a gate of the reset transistor M1, and TG 405 denotes a transmission control signal applied to a gate of the transmission transistor M2. C_S1 410, C_S2 415, C_S3 420, and C_S4 425 respectively denote control signals respectively controlling turning on or off of the first switch S1, the second switch S2, a third switch S3, and a fourth switch S4. Here, the control signal C_S1 may have a waveform the same as that of the reset control signal RG 410.

RAMP_EN 430 denotes a ramp activation signal output from the ramp signal generator 14 of FIG. 1. When the ramp activation signal RAMP_EN 430 is at an activation level, for example, the ramp activation signal RAMP_EN 430 goes logic high, a ramp signal Vramp varies according to a desire slope (or, alternatively a predetermined slope). Also, when the ramp activation signal RAMP_EN at the activation level is output, a counter (not shown) included in the ADC 12 of FIG. 1 may start counting in order to determine a gain of the ADC 12.

Vin 435 denotes an output signal of the unit pixel circuit 310 as described above.

IN1 450 denotes a signal applied to one input of the comparator 350, and Vx 445 denotes a signal applied to the other input of the comparator 350.

Vramp 440 denotes a ramp signal output from the ramp signal generator 14, the definition and operation of which is considered to be commonly known to those of ordinary skill in the technical field to which the present invention pertains.

OUT1 450 denotes an output signal of the differential amplifier 351 included in the comparator 350. IN2 455 denotes a signal input to an inverter 353 included in the comparator 350. OUT2 460 denotes an output signal of the inverter 353.

The construction and operation of a CDS circuit according to an embodiment will now be described in greater detail with reference to FIGS. 3A and 4.

First, the reset control signal RG that goes logic high is applied to the reset transistor M1 before a point of time t1, and the voltage of the floating diffusion node FD is reset to a high power supply voltage VDD.

Thus, the output signal Vin of the unit pixel circuit 310 is output at a voltage according to the reset signal Vres. The high power supply voltage VDD applied to the floating diffusion node FD via the reset transistor M1 is transformed to the reset signal Vres by the source follower transistor M3 and the selection transistor M4. For example, if a voltage between the source and drain of the source follower transistor M3 is Vsd_M3 and a voltage between the source and drain of the transistor M4 is Vsd_M4, the voltage level of the reset signal Vres is (VDD-Vsd_M3-Vsd_M4). Hereinafter, a voltage level according to the reset signal Vres will be referred to as 'voltage Vres'.

At the point of time t1, all the first through fourth switches S1, S2 S3, and S4 are turned on. Thus, the signal IN1 applied to the second node N2 has the voltage Vres. Because the third switch S3 is turned on, the differential amplifier is used as buffer, the voltages of both input terminals of the differential amplifier 351 are the same. Thus, the signal Vx also has the voltage Vres. Also, because the third switch S3 is turned on, the output signal OUT1 applied to the fourth node N4 connected to the third node N3 also has the voltage Vres, similar to the signal Vx.

The ramp signal Vramp is output at an initial voltage Vcom before the ramp activation signal RAMP_EN at the activation level is output. The initial voltage Vcom may vary according to the specification of or a manufacturer of a CMOS image sensor (CIS).

At a point of time t2, the transmission control signal TG that goes logic high is output, thus turning on the transmission transistor M2. Accordingly, for example, photo charges collected in the photo diode 311 are transmitted to the floating diffusion node FD, and the image signal Vsig having a voltage corresponding to the amount of photo charges is output at the first node N1. For example, the image signal Vsig is output as an output signal of the unit pixel circuit 310. The voltage level of the image signal Vsig will be referred to as voltage Vsig.

At a point of time t3, the first and second switches S1 and S2 are turned on.

Because the switch S1 is turned on, the voltage of the signal IN1 drops by the voltage Vsig at the point of time t3. Thus, the voltage of the signal IN1 is (Vres−Vsig). Here, the second capacitor C2 stores a voltage corresponding to the difference between the voltages of the reset signal Vres and the Image signal Vsig output from the unit pixel circuit 310.

Even after the point of time t3, the voltage Vres stored in the first capacitor C1 at the point of time t1 is maintained. Thus, the voltage of the signal Vx is maintained at a constant level before and after the point of time t3.

A voltage output OUT1 from the differential amplifier 351 at the point of time t3 is at logic low, because the output voltage OUT1 is determined by comparing voltages applied to both ends of the differential amplifier 351 with each other. For example, voltages applied to a non-inversion (+) input terminal and an inversion (−) input terminal are compared with each other, and a signal that goes high is output when the voltage applied to the non-inversion (+) input terminal is higher than the voltage applied to the inversion (−) input terminal. Adversely, a signal that goes low is output when the voltage applied to the non-inversion (+) input terminal is lower than the voltage applied to the inversion (−) input terminal.

At a point of time t4, the ramp activation signal RAMP_EN is at an activation level, for example, the ramp activation signal RAMP_EN goes logic high. Then, the value of the ramp signal Vramp that has a desired slope (or alternatively, a predetermined slope) linearly decreases in response to the ramp activation signal RAMP_EN. Also, the voltage of the signal Vx changes according to the voltage of the ramp signal Vramp, and thus, the voltage of the signal Vx changes to be equal to that of the ramp signal Vramp. Because the ramp activation signal RAMP_EN is activated, the counter included in the ADC 12 starts counting.

The voltage of the signal Vx gradually decreases according to a change in the voltage of the ramp signal Vramp, and becomes equal to the voltage of the signal IN1 at a point of time t5. Then, the voltage applied to the non-inversion (+) input terminal of the differential amplifier 351 is greater than that applied to the inversion (−) input terminal thereof, and thus, the output signal OUT1 of the differential amplifier 351 that goes logic high is output at the point of time t5. Also, the result of counting until the point of time t5, which corresponds to a period of time <a>, is determined to be a gain of analog-to-digital conversion.

As described above, in order to form a logic device between the output terminal of the unit pixel circuit 310 and input terminal of the comparator 350, a p-n junction, an oxide layer, routing metal, and a metal contact are generated. Next, the p-n junction, the oxide layer, routing metal, and the metal contact cause parasitic capacitors, such as a gate-oxide capacitor and a junction capacitor, to be generated near the input terminal of the comparator 350.

In order to prevent such a problem, according to an embodiment, the CDS circuit 330 may directly apply the output signal of the unit pixel circuit 310 to the input terminal of the comparator 350. For example, any logic device, such as a capacitor, is not disposed between the output terminal of the unit pixel circuit 310 and input terminal of the comparator 350.

Thus, it is possible to prevent a parasitic capacitor from being generated. Also, it is possible to prevent a DC voltage generated by the ramp signal generator 14 from being supplied by connecting the first capacitor C1 to the other input terminal of the comparator 350 via which the ramp signal Vramp is received.

For example, referring to FIG. 3A, no parasitic capacitor is generated near the input terminal of the comparator 350, and the signal IN1 that is substantially applied to the input terminal of the comparator 350 may be expressed as follows:

$$IN1 = (Vres - Vsig) \cdot \frac{C2}{C2} = (Vres - Vsig) \quad (2)$$

Figure 2:
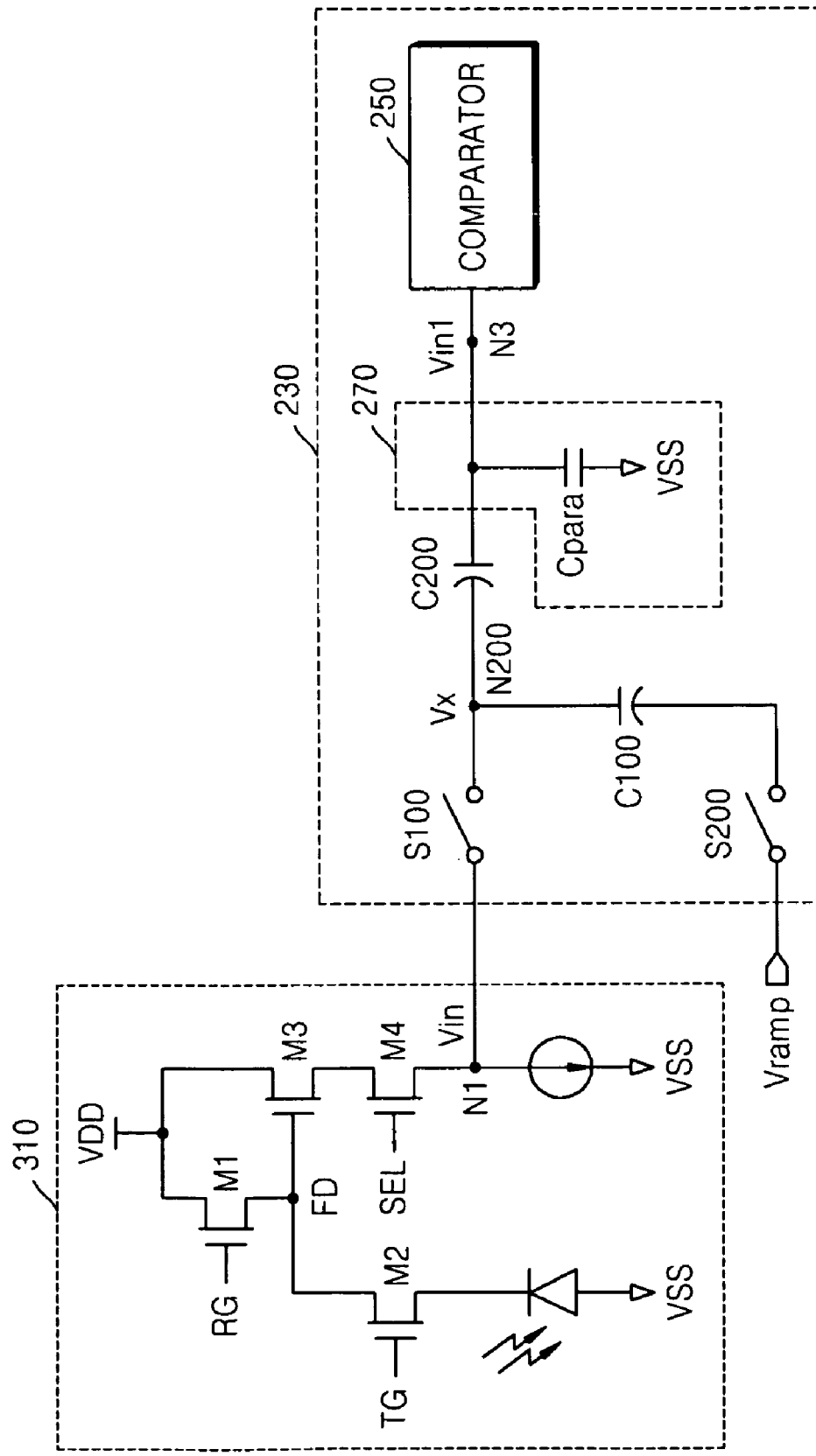
FIG. 2 is a circuit diagram of a conventional correlated double sampling (CDS) circuit.

Accordingly, unlike the conventional CDS circuit illustrated in FIG. 2, signal reduction due to a parasitic capacitor does not occur. Therefore, a signal to noise ratio (SNR) in the CDS circuit 330 is greater than in the conventional CDS circuit.

FIG. 5 is a circuit diagram of a CDS 550 that is a modified version of the CDS circuit illustrated in FIG. 3A, according to an embodiment. Referring to FIGS. 3A and 5, the construction and operation of the CDS 550 are the same as those of the CDS 330 illustrated in FIG. 3A except that it does not include the first switch S1 and the second capacitor C2.

Referring to FIG. 5, an output signal Vin of a unit pixel circuit 310 is directly applied to one input terminal (non-inversion (+) input terminal) of a comparator 550, and a ramp signal Vramp is applied to the other input terminal (inversion (−) input terminal) of the comparator 550 via a first capacitor C1.

If a potential Vres according to a reset signal is applied to a non-inversion input terminal of a differential amplifier 351 directly, the voltage of an eleventh node N11 is maintained equal to a voltage Vres, and a reset potential Vres is stored in a twelfth node N12.

Next, if a potential Vsig according to an image signal is applied, the voltage of the eleventh node N11 changes to equal the voltage Vsig. Thus, the difference of the reset potential Vres and the signal potential Vsig is stored in the twelfth node N12, and the voltage Vsig of the image signal output from the unit pixel circuit 310 is transmitted to the first node N11, thereby performing correlated double sampling as described above with reference to FIG. 3A.

According to the above embodiments, in a CDS circuit, an output terminal of a unit pixel circuit is connected directly to an input terminal of the CDS circuit, thereby reducing an occurrence of a parasitic capacitor. A reduction in the occurrence of a parasitic capacitor may improve the sensitivity of an output image signal.

The above-disclosed subject matter is to be considered illustrative, and not restrictive, and the appended claims are intended to cover all such modifications, enhancements, and other embodiments, which fall within the true spirit and scope of the present invention as understood by those of skill in the art. Thus, to the maximum extent allowed by law, the scope of the present invention is to be determined by the broadest permissible interpretation of the following claims and their equivalents, and shall not be restricted or limited by the foregoing detailed description.

What is claimed is:

1. A correlated double sampling circuit comprising:
a first capacitor configured to receive a ramp signal via a first end, the ramp signal varying with time;
a comparator configured to receive the ramp signal and an output signal of a unit pixel circuit via a differential amplifier included in the comparator, and configured to compare the output signal with the ramp signal, the comparator being configured to directly receive the output signal of the unit pixel circuit at a first input terminal of the differential amplifier, and a second input terminal of the differential amplifier being connected to a second end of the first capacitor; and
a second capacitor, including a first end connected to the first input terminal of the differential amplifier, and a second end connected to a ground voltage source.

2. The circuit of claim 1, further comprising:
a first switch configured to selectively allow the output signal of the unit pixel circuit to be received by the first input terminal of the differential amplifier such that the first switch controls application of an image signal to the first input terminal of the differential amplifier, in response to a first switch control signal.

3. The circuit of claim 2, further comprising:
a second switch configured to selectively allow the ramp signal to be received by the first end of the first capacitor such that the second switch is configured to control application of the ramp signal to the second input terminal of the differential amplifier, in response to a second switch control signal.

4. The circuit of claim 3, wherein the comparator further comprises:
a third switch connected between the second input terminal of the differential amplifier and an output terminal of the differential amplifier, the third switch configured to turn on in response to a third switch control signal.

5. The circuit of claim 1, wherein the second capacitor is an n-type metal oxide semiconductor (NMOS) capacitor.

6. The circuit of claim 1, further comprising:
a first switch configured to selectively allow the ramp signal to be received by the first end of the first capacitor such that the first switch is configured to control application of the ramp signal to the second input terminal of the differential amplifier, in response to a first switch control signal.

7. A circuit comprising:
a first capacitor configured to receive a ramp signal via a first end, the ramp signal varying with time; and
a comparator configured to receive the ramp signal and an output signal of a unit pixel circuit via a differential amplifier included in the comparator, and configured to compare the output signal with the ramp signal, the comparator being configured to directly receive the output signal of the unit pixel circuit at a first input terminal of the differential amplifier, and a second input terminal of the differential amplifier being connected to a second end of the first capacitor, the comparator including a first switch connected between the second input terminal of the differential amplifier and an output terminal of the differential amplifier, the first switch configured to turn on in response to a first switch control signal.

8. A correlated double sampling circuit comprising:
a first capacitor configured to receive a ramp signal via a first end, the ramp signal varying with time;
a comparator configured to receive the ramp signal and an output signal of a unit pixel circuit via a differential amplifier included in the comparator, and configured to compare the output signal with the ramp signal, the comparator being configured to receive the output signal of the unit pixel circuit at a first input terminal of the differential amplifier, and a second input terminal of the differential amplifier being connected to a second end of the first capacitor; and
a second capacitor, including a first end connected to the first input terminal of the differential amplifier, and a second end connected to a ground voltage source,
wherein no capacitor is disposed between the unit pixel circuit and the first input terminal.

9. The circuit of claim 8, further comprising:
a first switch configured to selectively allow the output signal of the unit pixel circuit to be received by the first input terminal of the differential amplifier such that the first switch controls application of an image signal to the first input terminal of the differential amplifier, in response to a first switch control signal.

10. The circuit of claim 9, further comprising:
a second switch configured to selectively allow the ramp signal to be received by the first end of the first capacitor such that the second switch is configured to control application of the ramp signal to the second input terminal of the differential amplifier, in response to a second switch control signal.

11. The circuit of claim 10, wherein the comparator further comprises:
a third switch connected between the second input terminal of the differential amplifier and an output terminal of the differential amplifier, the third switch configured to turn on in response to a third switch control signal.

12. The circuit of claim 8, wherein the second capacitor is an n-type metal oxide semiconductor (NMOS) capacitor.

13. The circuit of claim 8, further comprising:
a first switch configured to selectively allow the ramp signal to be received by the first end of the first capacitor such that the first switch is configured to control application of the ramp signal to the second input terminal of the differential amplifier, in response to a first switch control signal.

14. A circuit comprising:
a first capacitor configured to receive a ramp signal via a first end, the ramp signal varying with time; and
a comparator configured to receive the ramp signal and an output signal of a unit pixel circuit via a differential amplifier included in the comparator, and configured to compare the output signal with the ramp signal, the comparator being configured to receive the output signal of the unit pixel circuit at a first input terminal of the differential amplifier, and a second input terminal of the differential amplifier being connected to a second end of the first capacitor,
wherein no capacitor is disposed between the unit pixel circuit and the first input terminal, and
the comparator includes a first switch connected between the second input terminal of the differential amplifier and an output terminal of the differential amplifier, the first switch configured to turn on in response to a first switch control signal.

* * * * *